(12) United States Patent  
Zach et al.

(10) Patent No.: US 8,362,442 B2  
(45) Date of Patent: Jan. 29, 2013

(54) CORRECTOR

(75) Inventors: Joachim Zach, Oestringen (DE); Stephan Uhlemann, Heidelberg (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 220 days.

(21) Appl. No.: 12/973,984

(22) Filed: Dec. 21, 2010

(65) Prior Publication Data

US 2012/0153147 A1  Jun. 21, 2012

(30) Foreign Application Priority Data

Dec. 15, 2010  (DE) .......................... 10 2010 054 541

(51) Int. Cl.
*H01J 37/141* (2006.01)
(52) U.S. Cl. ................................. 250/396 ML
(58) Field of Classification Search ............ 250/396 ML
See application file for complete search history.

(56) References Cited

U.S. PATENT DOCUMENTS

| 2004/0004192 | A1* | 1/2004 | Krivanek et al. | ......... 250/396 R |
| 2006/0219935 | A1 | 10/2006 | Henstra | |
| 2008/0296509 | A1 | 12/2008 | Schroder | |
| 2009/0101818 | A1* | 4/2009 | Zach | ............ 250/311 |
| 2012/0193533 | A1* | 8/2012 | Zach | ............ 250/310 |

FOREIGN PATENT DOCUMENTS

DE  42 04 512  8/1993

OTHER PUBLICATIONS

O. Scherzer, "Sphaerische und chromatische Korrektur von Elektronen-Linsen", Optik, DE, Jena, 1947, p. 114-132.
Keiji Tamura et al. "Third-order spherical aberration correction using multistage self-aligned quadrupole correction-lens systems", Journal of Electron Microscopy 59(3): 197-206 (2010).
O.L. Krivanek et al., "Towards sub-A electron beams", Ultramicroscopy 78 (1999) 1-11.
H. Rose et al., "Aberration Correction in Electron Microscopy", Proceedings of 2005 Particle Accelerator Conference, Knoxville, Tennesse.

* cited by examiner

*Primary Examiner* — Jack Berman
*Assistant Examiner* — Eliza Osenbaugh-Stewart
(74) *Attorney, Agent, or Firm* — Paul Vincent

(57) ABSTRACT

A corrector (10) for an electron microscope is proposed which is less sensitive to fluctuations of the electrical power supply if a stigmatic intermediate image (9) of the axial fundamental rays ($x_\alpha$, $y_\beta$) is produced in the quadrupole field (1') of a first quadrupole element (1) and this quadrupole field (1') is set such that astigmatic intermediate images (12, 13) of the off-axial fundamental rays ($x_\gamma$, $y_\delta$) are produced in the region of the center of the quadrupole fields (3', 4') of a third (3) and fourth multipole element (4) and there also, due to the setting of the quadrupole field (2') of a second quadrupole element (2), the axial fundamental rays ($x_\alpha$, $y_\beta$) of the same section (x, y) as that, in which the intermediate images (12, 13) of the off-axial fundamental rays ($x_\gamma$, $y_\delta$) are located, each exhibit a maximum.

16 Claims, 3 Drawing Sheets

CORRECTOR

BACKGROUND OF THE INVENTION

The invention relates to a corrector for correcting chromatic and spherical aberrations in an electron microscope with six multipole elements disposed consecutively in the beam path such that they are symmetric about a plane of symmetry, of which all are used for generation of quadrupole fields and the third and fourth also for generation of octupole fields, wherein the latter are oriented in the same direction and the quadrupole fields of all six multipole elements are rotated through 90° from one to the next and are centrosymmetric about the point of intersection between the optical axis and the plane of symmetry, wherein the following exchange symmetries are produced: exchange symmetry of the axial fundamental rays with the plane of symmetry as the reflection plane for exchange of the trajectory of the axial fundamental rays, and exchange symmetry of the off-axial fundamental rays with the point of intersection between the optical axis and the plane of symmetry as the point for centrosymmetric exchange of the trajectory of the off-axial fundamental rays, and wherein, thereafter, all fundamental rays are made to converge again at the end of the corrector, wherein correction of the chromatic aberration is possible by the interaction between the magnetic and electric quadrupole fields within the third and fourth multipole element and correction of the spherical aberration is possible by means of the quadrupole fields and the octupole fields.

The purpose of such a corrector is to compensate for the chromatic and spherical aberrations of the optical components of the microscope. However, compensation using such correctors not only compensates for aberrations of the beam source and lenses of the electron microscope but also aberrations caused by the corrector itself.

The basis for the function of all corrections in particle optics is the discovery by O. Scherzer (O. Scherzer: "Sphärische and chromatische Korrektur von Elektronen-Linsen" OPTIK, DE, JENA, 1947, pages 114-132, XP002090897, ISSN: 0863-0259) that correction of chromatic and spherical aberrations is possible for particle beams, too, if non-rotationally symmetrical fields are deployed with which astigmatic intermediate images are generated and this astigmatism is subsequently removed again. O. Scherzer states the conditions under which this can be achieved (Loc. cit.). These conditions known as Scherzer's theorem are the basis for all correction of chromatic and spherical aberrations in particle optics.

From DE 10 2007 049 816 B3, a corrector comprising five multipole elements is known which, however, itself causes not inconsiderable higher-order aberrations, making compensation of aberrations more difficult.

DE 42 04 512 A1 proposed a corrector of the type stated in the introduction that causes fewer higher-order aberrations but is extremely sensitive to field fluctuations of the quadrupole fields. These field fluctuations, also termed "noise," are due to fluctuations of the supply current and voltage. Sensitivity to these fluctuations proved so great in the test phase of a corrector built according to this reference that it was not possible to control this sensitivity with a highly stabilized electrical power supply with reasonable technical effort. For this reason, implementation of this corrector and the patent application stated above were abandoned.

The object of the invention is to develop further a corrector of the type stated in the introduction in such a way that it is insensitive to fluctuations of the electrical power supply.

SUMMARY OF THE INVENTION

According to the invention, this object is achieved by means such that a stigmatic intermediate image of the axial fundamental rays is produced in the quadrupole field of the first quadrupole element and this quadrupole field is set such that astigmatic intermediate images of the off-axial fundamental rays are produced in the region of the center of the quadrupole fields of the third and fourth multipole element and there also, due to the setting of the quadrupole field of the second quadrupole element, the axial fundamental rays of the same section as that, in which the intermediate images of the off-axial fundamental rays are located, each exhibit a maximum.

The inventive corrector is much less sensitive to fluctuations of the electrical power supply, which either considerably reduces the effort for a highly stabilized power supply and/or avoids impairment of the image quality due to such fluctuations.

This sensitivity to fluctuations of the power supply and therefore of the field strengths of the relevant fields results from the ray height of the fundamental rays in each quadrupole, wherein the sensitivity increases quadratically with the ray height. In particular, the axial fundamental rays that pass through the zero point in the first quadrupole in the inventive corrector are involved therein because the corrector is disposed in the beam path of an electron microscope in such a way that a stigmatic intermediate image of the axial fundamental rays $x_\alpha$ and $y_\beta$ is produced in the quadrupole field of the first quadrupole element. These then do not increase very greatly toward the second quadrupole. By contrast, the axial fundamental rays in the corrector of DE 42 04 512 A1 already exhibit a relative height in the first quadrupole, and the fundamental ray $y_\beta$ even exhibits a maximum in the second quadrupole. The same applies, of course, to the fifth and sixth quadrupoles because of the central symmetry (also called antisymmetry) of the fields. However, for correction to be successful, such maxima are only required in the third or fourth quadrupole. Thus, in the inventive corrector, highly stabilized electrical power supply is only required for the third and fourth multipole element because only there are quadrupole fields required that are almost free of field strength fluctuations. All other multipole elements do not require this power supply precision. This greatly reduces the effort for the electrical power supply and/or avoids impairment of the image quality and resolution due to such fluctuations of the electrical power supply.

In this way, the invention avoids both the image impairment due to fluctuations of the power supply that occur with the corrector of DE 42 04 512 A1 and the higher-order aberrations that occur with the corrector of DE 10 2007 049 816 B3.

All fields of the first, second, fifth and sixth multipole element, and the octupole fields of the third and fourth multipole element can be magnetic fields or electric fields or a combination of the two. Only the quadrupole fields of the third and fourth multipole element must be cooperating electric and magnetic fields.

The inventive corrector is initially based on the known functions according to the teaching of O. Scherzer (Loc. cit.) that the quadrupole field of the first multipole element imposes a deviation from rotational symmetry on the beam with respect to the off-axial fundamental rays so that, in two mutually perpendicular main sections, the x and the y section, the beams exhibit differently divergent trajectories. Because the axial fundamental rays in the first quadrupole field have a stigmatic intermediate image, their trajectory remains unaffected. The following quadrupole field of the second multipole element rotated through 90° causes the axial fundamental rays also to exhibit divergent trajectories and, at the same time, influences the gradient of the off-axial fundamental rays, wherein the fundamental ray $y_\delta$ passes through a maximum. In the third multipole element, which generates a stronger quadrupole field than the first two, the first intermediate image of the off-axial fundamental rays is produced and, at the same time, a maximum of one of the axial fundamental rays, which are each located approximately in the same region of the third quadrupole field, occurs. This constellation causes a considerable reduction in the fifth-order combination aberration.

After the plane of symmetry between the third and the fourth multipole element, exchange symmetry results. Exchange symmetry in this sense means that the beam trajectories of the x section and the y section are exchanged.

Such exchange symmetry could be mirror symmetry. This is the case of the axial fundamental rays $x_\alpha$ and $y_\beta$. This means that, after the plane of symmetry, fundamental ray $y_\beta$ is mirror-symmetric with respect to fundamental ray $x_\alpha$ before the plane of symmetry and vice versa.

Such exchange symmetry can, however, also be central symmetry or antisymmetry. This is the case for the off-axial fundamental rays $x_\gamma$ and $y_\delta$. This means that central symmetry occurs about the point of intersection between the plane of symmetry and the optical axis so that the fundamental ray $y_\delta$ after the plane of symmetry exhibits the same trajectory as the fundamental ray $x_\gamma$ before the plane of symmetry, but mirrored around the point of symmetry. Conversely, the fundamental ray $x_\gamma$ after the plane of symmetry exhibits the same trajectory as the fundamental ray $y_\delta$ before the plane of symmetry, but also mirrored centrosymmetrically.

The constellation described above also occurs in the fourth quadrupole in that an astigmatic intermediate image of the off-axial fundamental rays $x_\gamma$ and $y_\delta$ (now the second astigmatic intermediate image) is located approximately in the same region as a maximum of one axial fundamental ray. The quadrupole field has the opposite sign, that is, it is rotated through 90°. Accordingly, the second astigmatic intermediate image is rotated through 90° (see FIG. 2). There, the abovementioned correction acts in a region of the beam that is perpendicular with respect to the aforementioned region. This corresponds to Scherzer's principle of the correction of particle beams by deformation of the beam such that it extends consecutively in the region of two mutually perpendicular planes.

Because of the antisymmetric or centrosymmetric nature of the quadrupole fields in which the first and the sixth, the second and the fifth and the third and the fourth have the same absolute value, but are oriented in opposite directions, the beam, which enters the corrector as a round beam, exits it again as a round beam.

Correction of the chromatic aberration is achieved by means of these deformations of the beam, wherein this is performed with the third multipole element with respect to one section, for example the x-section, and with the fourth multipole element with respect to the other section, for example, the y-section. The function for correction of the chromatic aberration corresponds to the known Wien filter and is based on the quadrupole fields comprising mutually superposed electric and magnetic quadrupole fields. The field strengths are dimensioned such that electrons of a certain velocity—that is, having a certain energy and, in terms of light optics, a certain color—pass through the fields on their predetermined path. The electrons having deviating energies leave the predetermined path and can thus compensate for the chromatic aberration of the round lenses of the microscope, in particular, of the objective lens. The combination of an electric and a magnetic field is therefore only required for this correction of the chromatic aberration.

The spherical aberration is also corrected in the third and fourth multipole element by means of their octupole fields. The spherical aberrations come from the rotationally symmetric lenses of the electron microscope because they influence the beams that are further away from the optical axis more strongly. This results in the beams not forming a common point of intersection with the optical axis in the region of the intermediate images. In the region of the astigmatic intermediate images, the beams of each section, which does not pass through zero, can be influenced by the octupole fields in such a way that the beams intersect the image plane again. If the correction is performed successively for the beams of each section and these beams are then made to converge again to form a round beam, the spherical aberration has been corrected. Therein, it is not only possible to correct spherical aberrations of upstream round lenses; aberrations of downstream round lenses can also be compensated for in advance. A spherical aberration is then imposed on the beam path such that it cancels the spherical aberrations of the downstream round lenses, for example, the objective lens.

With these known corrections, however, the problem arises that the corrector itself causes aberrations. These are primarily non-round aberrations, in particular, a third-order fourfold astigmatism and a fifth-order star aberration. The non-round aberrations form axial image aberration figures such as astigmatism, star aberration, rosette aberration and coma, which occur in different orders. The remaining round aberration is a fifth-order spherical aberration, which, as described above, is largely eliminated by the constellation of astigmatic intermediate images of the off-axial fundamental rays and simultaneous maximum for each axial fundamental ray in the third and fourth multipole.

Embodiments of the invention are used for even better compensation of aberrations, in particular, for a further reduction of higher-order aberrations.

To this end, a further multipole element is proposed that is most optimally disposed in the region in which axial fundamental rays $x_\alpha$ and $y_\beta$ coincide. This can be done in two ways:

Outside the multipole elements because the first multipole element separates the fundamental rays $x_\alpha$ and $y_\beta$ and the sixth multipole element makes them converge again.

Or in the plane of symmetry because axial fundamental rays $x_\alpha$ and $y_\beta$ intersect there.

If an octupole field is generated with the further multipole element, it can be used to compensate for a third-order astigmatism, that is, by setting a suitable field strength.

To also compensate for all aberrations up to the fifth order down to small residual aberrations, it is proposed that, irrespective of which of the above-mentioned configurations has been chosen, the further multipole element and the third and the fourth multipole element generate duodecapole fields to make said corrections by setting these fields.

The following embodiments of the invention are also intended to eliminate the remaining residual aberrations to the greatest extent possible. These small residual aberrations are caused by the round lenses located outside the corrector. These include, in particular, a reduced but still undesirable fifth-order spherical aberration.

For this purpose, two transfer lenses constituted as round lenses whose fields can be set in such a way that the higher-order round aberrations disappear are assigned to the corrector on the objective lens side. However, this measure, in turn, results in aberrations, in particular, correction of the third-order spherical aberration and correction of the chromatic aberration are partially reversed. For that reason, readjustment of the third and fourth multipole elements is beneficial, wherein both the quadrupole fields and the octupole fields have to be readjusted. In readjustment of the quadrupole fields, the magnetic and electric fields must be adjusted simultaneously to the extent that correction of the chromatic aberration—as described above—is retained. Deviation from this simultaneous adjustment is, however, necessary because a chromatic aberration recurring due to the setting of the transfer lenses has to be readjusted.

Because insertion of the transfer lenses and every setting modification, such as the above-mentioned readjustment, changes the beam path again, it is beneficial to eliminate recurring higher-order aberrations by readjustment of the duodecapole fields of the third and fourth multipole and of the duodecapole field of the further multipole element provided in addition to the six multipole elements.

Because readjustment of the third and fourth multipole elements and of the additional multipole element cause higher-order round aberrations to occur again, the transfer lenses have to be readjusted again and the multipole elements must also be subsequently readjusted again in the prescribed manner. Because each adjustment of the aforementioned elements in the manner described causes aberrations to recur, the aforementioned individual steps must be performed iteratively until all aberrations are reduced to a level that is tolerable for the desired imaging.

A corrector of the inventive type can, in principle, be inserted into any electron microscope. However, it is especially suitable for electron microscopes that work on the scanning principle, that is, scanning electron microscopes (known as SEM) and scanning transmission electron microscopes (known as STEM). The inventive corrector meets the constructive requirements, such as spatial structure, windings and material properties and the necessary setting ranges for current and/or voltage to generate and control the field strengths of the relevant magnetic and/or electric fields to be able to make the settings and adjustments or readjustments described.

Characterization of the fields of the corrector to enable settings and adjustments or readjustments therefore means the following: Electrodes and/or electromagnets and the options for applying current and voltage to them must be structurally constituted such that, after installation of the corrector in an electron microscope, the stated correction measures are possible. These settings, adjustments and readjustments are performed after installation and commissioning of the relevant electron microscope because the specific settings depend both on the design of the electron microscope and on the individual lens aberrations that also occur in individual electron microscopes of the same series, for example, due to dimensional imprecision and material inhomogeneities. Readjustment is also necessary from time to time during operation of an electron microscope because even the slightest contamination with dirt can alter the optical properties and make readjustment necessary. The invention is implemented in a corrector that permits these possibilities for correcting the electron beam. The specific structural design of the corrector and the current and/or voltage ranges available in a specific case that are necessary for settings and corrections, depend on the design of each electron microscope, in particular, on the beam voltages of each of the possible working ranges and the specific design of the lens system and scanning facility.

Because the stated properties of the inventive corrector take effect only after installation in an electron microscope, the invention also relates to a scanning electron microscope or scanning transmission electron microscope with a corrector of the above-mentioned type, in which correction of the electron beam in the prescribed manner is possible.

The invention is explained based on the following drawings:

DESCRIPTION OF THE PREFERRED EMBODIMENT

Figure 1:
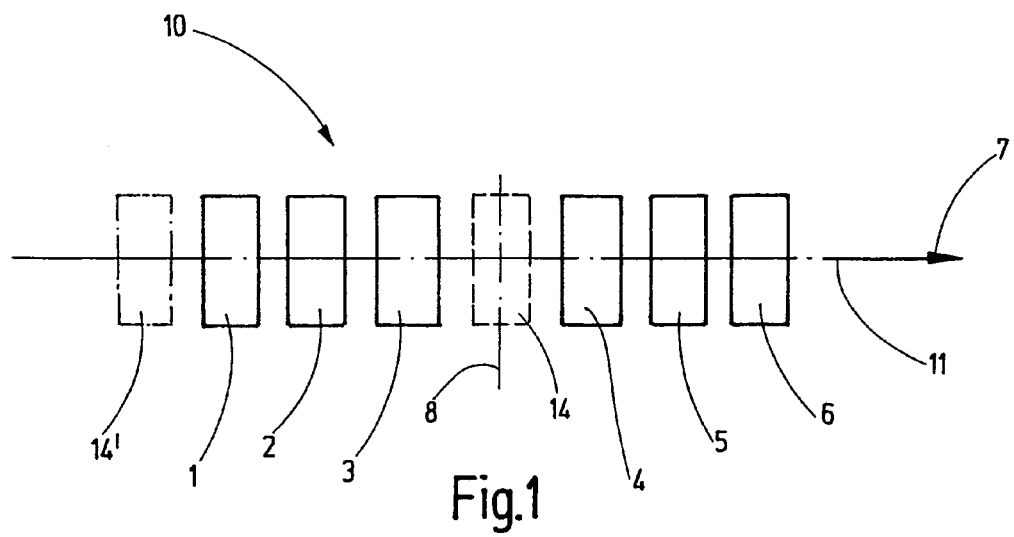
FIG. 1 shows a schematic view of the inventive corrector with reference to embodiments, FIG. 2 corresponding to FIG. 1 shows the beam path in planes x and y and the configuration of the fields.

FIG. 1 shows a schematic view of the inventive corrector 10. A first multipole element 1, a second multipole element 2 and a third multipole element 3 are disposed along the optical axis 11 in the direction of the beam path 7. After a plane of symmetry 8, three multipole elements 4, 5, 6 then follow, wherein these are symmetric to the multipole elements 1, 2 and 3 with respect to their configuration and must also be installed symmetrically with respect to the plane of symmetry 8. The multipole element 1 corresponds to the multipole element 6; the multipole element 2, to the multipole element 5; and the multipole element 4, to the multipole element 3.

As a further embodiment of the basic idea of the invention, a further multipole element 14 (shown dashed) can be disposed in the plane of symmetry 8. Alternatively, the further multipole element 14' (shown dotted-and-dashed) can also be disposed outside the six multipole elements 1, 2, 3, 4, 5 and 6.

Figure 2:
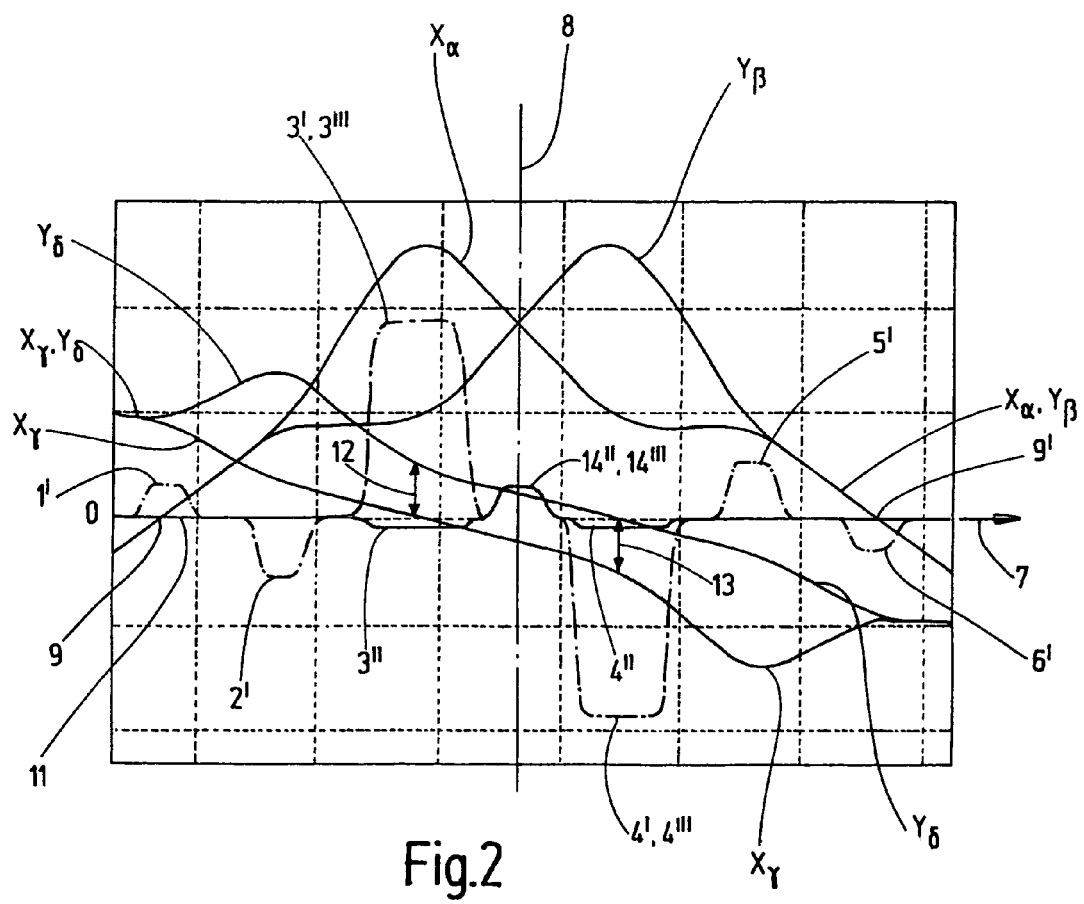

FIG. 2 shows the beam trajectory of the corrector 10 in two mutually perpendicular planes, that is, in the x-section and in the y-section with the beam paths of the axial fundamental rays $x_\alpha$ and $y_\beta$ and of the off-axial fundamental rays $x_\gamma$ and $y_\delta$. The fundamental rays $x_\alpha$ and $x_\gamma$ extend in the x-plane and the fundamental rays $y_\beta$ and $y_\delta$, in the y-plane, that is, along the optical axis 11, perpendicularly to the x-plane. Moreover, FIG. 2 shows the fields that are generated by the multipole elements 1, 2, 3, 4, 5 and 6 and the further multipole element 14. The beam path travels in the direction of the arrow 7 and the optical axis 11 extends through the "0" of the vertical scale.

As can be seen from viewing FIGS. 1 and 2 together, the first 1, the second 2, the fifth 5 and the sixth multipole element 6 are constituted for generation of quadrupole fields 1', 2', 5' and 6'. These may be electric or magnetic quadrupole fields 1', 2', 5', 6' or a combination of the two. For this purpose, the multipole elements 1, 2, 5 and 6 must have at least four electromagnets and/or four electrodes in a mirror-symmetric configuration about the optical axis 11.

The third 3 and fourth multipole element 4 are constituted as duodecapole elements, wherein they can generate electric and magnetic quadrupole fields 3', 4', for example, if the soft iron cores of the electromagnets are also used as electrodes. Current for the electromagnets or potential for the electrodes is applied to the third 3 and fourth multipole element 4 such that they generate magnetic quadrupole fields 3', 4' and electric quadrupole fields 3', 4', which interact to enable the correction of the chromatic aberration described in the introduction.

Further, the third and fourth multipole element 3, 4 generate octupole fields 3", 4" and duodecapole fields 3''' and 4''', which can also be electric or magnetic fields or a combination of the two. (FIG. 4 explains how an octupole field can be generated with a duodecapole element). FIG. 2 also shows the octupole field 14" of the further multipole element 14 and the duodecapole field 14''' generated by the latter.

First of all, formation of a non-round beam path is essential for the correction of chromatic aberrations and spherical aberrations, with astigmatic intermediate images 12, 13, wherein, here, the astigmatic intermediate images of the off-axial fundamental rays $x_\gamma$ and $y_\delta$ are used to achieve the corrections according to the teaching of Scherzer (see above).

With the astigmatic intermediate image 12, a line focus is produced in the y-direction because the beams of the x-section pass through zero. With the astigmatic intermediate image 13, a line focus is produced analogously in the x-direction. Thereafter, the beam paths are reunited to form a round beam x, y.

To generate this beam path, the six quadrupole fields 1', 2', 3', 4', 5' and 6' of the multipole elements 1, 2, 3, 4, 5 and 6 are used that act like combined cylindrical and round lenses in light optics. The quadrupole field 1' of the first multipole element 1 causes the off-axial fundamental rays $x_\gamma$ and $y_\delta$ of sections x and y to diverge, but not axial fundamental rays $x_\alpha$ and $y_\beta$. Because these form a stigmatic intermediate image 9 in the first quadrupole field 1', they remain unaffected. The quadrupole field 2' of the second multipole element 2 then causes axial fundamental rays $x_\alpha$ and $y_\beta$ to diverge and changes the gradient of the off-axial fundamental rays $x_\gamma$ and $y_\delta$. In this way, two objectives are achieved in the quadrupole field 3' of the third quadrupole element 3, namely a maximum of the axial fundamental ray $x_\alpha$ and, in the same region, an astigmatic intermediate image 12 of the off-axial fundamental rays $x_\gamma$ and $y_\delta$. On one hand, this constellation is the above-mentioned condition for a reduction of the fifth-order combination aberration and, on the other hand, the chromatic aberration is corrected by means of the interaction of the electric and magnetic quadrupole fields 3' and the spherical aberration is corrected using the octupole field 3". These aberration corrections are initially performed in the first section plane.

The above-mentioned beam trajectory further leads, in the plane of symmetry 8, to a point of intersection of the axial fundamental rays $x_\alpha$, $y_\beta$, which have opposite gradients at this point, and simultaneously resulting in $x_\gamma$ and $y_\delta$ having the same absolute value in the plane of symmetry 8 with different orientation with respect to the optical axis 11. Therefore, the third-order astigmatism can be corrected by the further multipole element 14 disposed in the plane of symmetry 8 by means of the octupole field 14". Moreover, correction of all aberrations up to the fifth order is effected by interaction of a duodecapole field 14''' of the further multipole element 14 with the duodecapole fields 3''' and 4''' of the third multipole element 3 and of the fourth multipole element 4.

In all these corrections, it must be noted that each correction of an aberration causes other aberrations, albeit attenuated. For that reason, readjustments have to be performed again here. For that reason, all correction steps must be performed consecutively by the iterative method already mentioned to approximate to an aberration minimum of acceptable magnitude.

After the plane of symmetry 8, the beam trajectory continues in two different types of exchange symmetry:

The axial fundamental rays $x_\alpha$ and $y_\beta$ exhibit mirror-symmetric exchange symmetry about the plane of symmetry 8. That means that the fundamental ray $y_\beta$ in the y-section extends after the plane of symmetry 8 as if it mirrored the fundamental ray $x_\alpha$ in the x-section before the plane of symmetry 8. Similarly, the fundamental ray $x_\alpha$ after the plane of symmetry 8 extends as if it mirrored the fundamental ray $y_\beta$ before the plane of symmetry 8.

The off-axial fundamental rays $x_\gamma$ and $y_\delta$, on the other hand, exhibit central symmetric or antisymmetric exchange symmetry. That means that the fundamental ray $y_\delta$ in the y-section after the plane of symmetry 8 extends like a centrally mirrored fundamental ray $x_\gamma$ in the x-section before the plane of symmetry 8. This corresponds to a central symmetry about the point of intersection between the plane of symmetry 8 and the optical axis 11. Analogously, the fundamental ray $x_\gamma$ after the plane of symmetry 8 extends like a centrally mirrored fundamental ray $y_\delta$ before the plane of symmetry 8.

This is achieved because the corresponding pairs of quadrupole fields 4', 5' and 6' of the multipole elements 4, 5 and 6 and the quadrupole fields 3', 2' and 1' of the multipole elements 3, 2 and 1 have the same absolute value but opposite signs (i.e. rotated through 90°). The off-axial fundamental rays $x_\gamma$ and $y_\delta$ form a further astigmatic intermediate image 13 in the quadrupole field 4' of the fourth multipole element 4 and the axial fundamental ray $y_\beta$ forms a maximum, whereby the above-mentioned aberration correction is also performed in the second section plane. Finally, axial fundamental rays $x_\alpha$ and $y_\beta$ then also form a stigmatic intermediate image 9' again in the quadrupole field 6' of the sixth quadrupole element.

Of course, sections x and y only serve to represent the beam deformation, which must be imagined in spatial terms. Such non-round fields are like cylindrical lenses in light optics, where it is also possible to eliminate the induced distortion of the beam path by inserting counteracting cylindrical lenses. The whole configuration is used to correct chromatic aberrations and spherical aberrations of an electron beam according to Scherzer's theorem.

Figure 3:
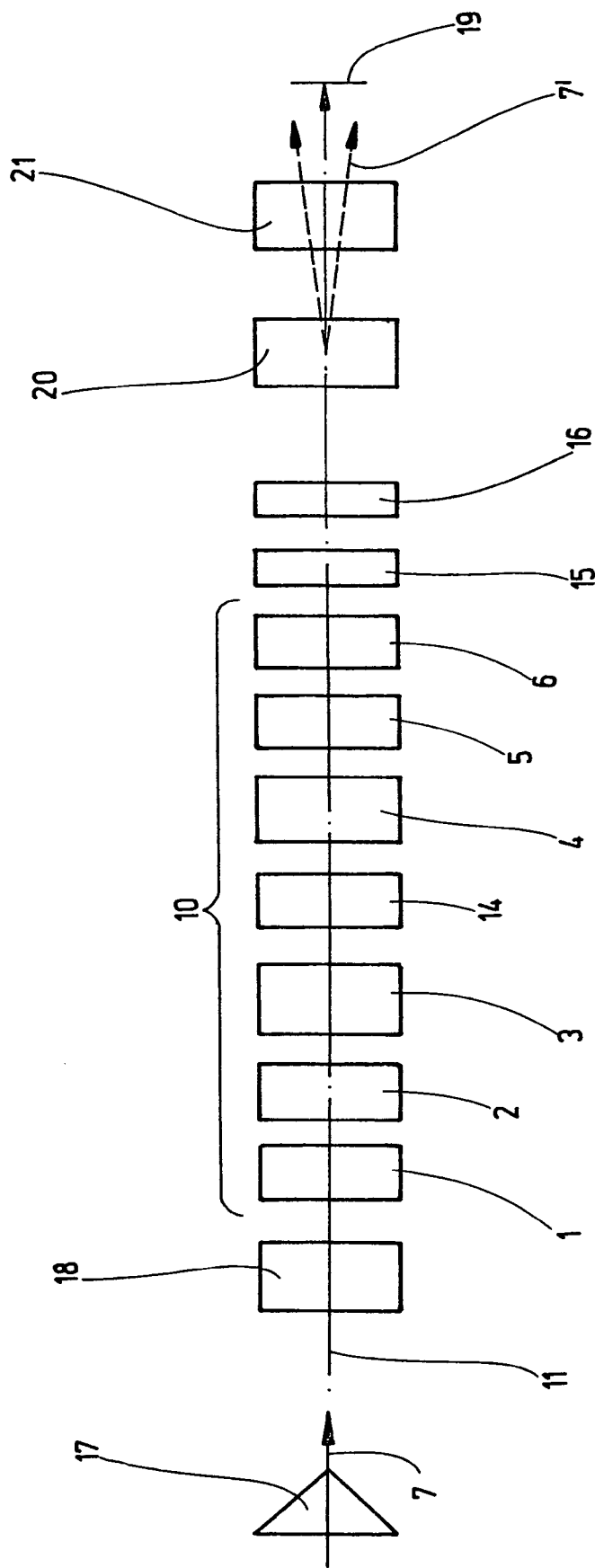
FIG. 3 shows a schematic partial view of an electron microscope with a corrector and FIG. 4 shows a schematic view of a duodecapole element that can generate all the above-mentioned fields.

FIG. 3 shows a schematic partial view of an electron microscope, which can be a scanning electron microscope or a scanning transmission electron microscope. The inventive corrector 10 is inserted in the beam path 7 after the beam source 17 and the condenser lens 18. After the corrector 10, the transfer lenses 15 and 16 follow with their round lens fields, wherein the correction quality of the corrector 10 can be further improved with the iterative setting described above.

After the transfer lenses 15 and 16, the deflection system 20 for generation of the deflected beam 7', that is, the scanning beam, follows, the latter being directed toward the object 19 by means of the objective lens 21. By scanning with the scanning beam 7', an image of the object 19 is generated.

Image generation in a scanning transmission electron microscope (usually known as: "STEM") is achieved by the scanning beam 7' radiating through a thinly sliced specimen, thus generating an image. In the scanning electron microscope (usually known as: "SEM"), secondary electrons are radiated back from the object 19 by the scanning beam 7'. These are detected by means of a detector, which is not depicted, and used for image generation. Today, electron microscopes working on the scanning principle are often designed to function as either a scanning transmission electron microscope or as a scanning electron microscope working on the reflection principle. The inventive corrector 10 is highly suitable for both modes of operation.

Figure 4:
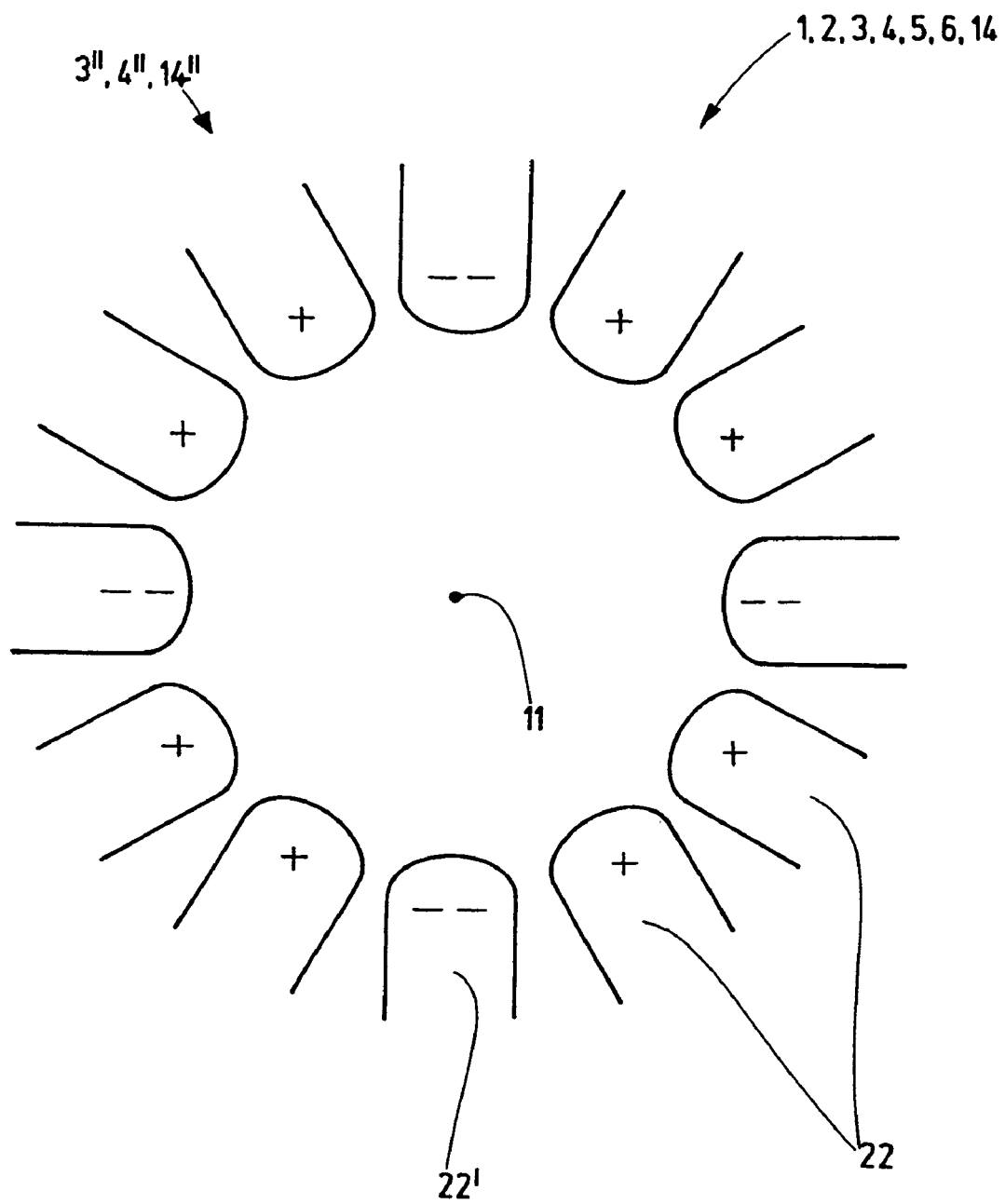

FIG. 4 shows a schematic representation of a multipole element, which may be one of the multipole elements 1, 2, 3, 4, 5, 6 or the further multipole element 14 or 14'. Twelve poles 22, 22' are mirror-symmetrically disposed about the optical axis 11. If a duodecapole field 3''', 4''' or 14''' is thus formed, the poles 22, 22' are always alternately north and south poles for generation of magnetic fields or negatively and positively charged electrodes for generation of electric fields.

If a combination of an electric and a magnetic field is to be generated, the soft iron cores of the electromagnets are simultaneously used as electrodes to which a voltage is applied.

If a quadrupole field 1', 2', 3', 4', 5' or 6' is to be generated, three electromagnets or electrodes 28, 28' with the same polarity or charge are always grouped together and the groups of three alternate as north and south poles or as negatively or positively charged electrodes. Here, too, electric and magnetic fields can be superposed. Such superposition can be used for interaction as in a Wien filter, as explained above for correction of the chromatic aberration with the magnetic and electric fields 3' and 4'. However, such interaction can also be used for field strengthening.

Of course, multipole elements that, like the multipole elements 1, 2, 5 and 6, only have to generate quadrupole fields 1', 2', 5' and 6', can also be structured more simply by having only four poles 22, 22', whose polarity alternates.

If, on the other hand, octupole fields 3", 4" or 14" are to be generated, the poles 22, 22' must alternate, as represented by the "+" and "−" signs. Two positively charged electrodes 22 and one negatively charged electrode 22' therefore alternate, wherein the negative charge (as symbolized by the two "−" signs) must be correspondingly strengthened to achieve the octupole field 3", 4" or 14" with the least possible distortion. Generation of a magnetic octupole is performed analogously. Of course, the stated alternating sequence can be constituted with the opposite charges.

Superposed fields, such as quadrupole field, octupole field and duodecapole field, generated by a single duodecapole element, are obtained by summating the currents or voltages in the poles 22, 22'—that is, in the electromagnets or electrodes. All the field superpositions mentioned above can be produced in this way.

LIST OF REFERENCE SYMBOLS 1, 2, 3, 4, 5, 6 multipole elements
1', 2', 3', 4', 5', 6' quadrupole fields of the multipole elements
3", 4" octupole fields of the multipole elements 3 and 4
3''', 4''' duodecapole fields of the multipole elements 3 and 4
7 beam path
7' deflected beam (scanning beam)
8 plane of symmetry
9, 9' stigmatic intermediate images of the axial fundamental rays $x_\alpha$ and $y_\beta$
10 corrector
11 optical axis
12, 13 astigmatic intermediate images of the off-axial fundamental rays $x_\gamma$ and $y_\delta$
14 further multipole element (disposed in the plane of symmetry 8)
14' further multipole element (disposed outside the multipole elements 1, 2, 3, 4, 5, 6)
14" octupole field of the further multipole element 14
14''' duodecapole field of the further multipole element 14
15, 16 transfer lenses
17 beam source
18 condenser lens
19 object
20 deflection system
21 objective lens
22 poles, constituted as an electromagnet and/or electrode—south pole of the positively charged electrode
22' poles, constituted as an electromagnet and/or electrode—north pole of the negatively charged electrode
x, y section
$x_\alpha$, $y_\beta$ axial fundamental rays
$x_\gamma$, $y_\delta$ off-axial fundamental rays

We claim:

1. Corrector for correcting chromatic and spherical aberrations in an electron microscope, the corrector comprising:
a first multipole element, said first multipole element disposed about a beam path and generating a first element quadrupole field;
a second multipole element disposed downstream of said first multipole element, said second multipole element disposed about said beam path and generating a second element quadrupole field, said second element quadrupole field rotated through 90° with respect to an orientation of said first element quadrupole field;
a third multipole element disposed downstream of said second multipole element, said third multipole element disposed about said beam path and generating a third element quadrupole field, said third element quadrupole field rotated through 90° with respect to an orientation of said second element quadrupole field, said third multipole element also generating a third element octupole field;
a fourth multipole element disposed downstream of said third multipole element, said fourth multipole element disposed about said beam path and generating a fourth element quadrupole field, said fourth element quadrupole field rotated through 90° with respect to an orientation of said third element quadrupole field, said fourth multipole element also generating a fourth element octupole field, wherein said fourth element octupole field is oriented in a same direction as said third element octupole field, correction of chromatic aberration thereby being effected by interaction between said third and said fourth element quadrupole fields;
a fifth multipole element disposed downstream of said fourth multipole element, said fifth multipole element disposed about said beam path and generating a fifth element quadrupole field, said fifth element quadrupole field rotated through 90° with respect to an orientation of said fourth element quadrupole field; and
a sixth multipole element disposed downstream of said fifth multipole element, said sixth multipole element disposed about said beam path and generating a sixth element quadrupole field, said sixth element quadrupole field rotated through 90° with respect to an orientation of said fifth element quadrupole field, wherein said first through sixth multipole elements are symmetric about a plane of symmetry, said first through sixth element quadrupole fields being centrosymmetric about a point of intersection between an optical axis and said plane of symmetry, wherein the corrector is structured to produce an exchange symmetry of axial fundamental rays with said plane of symmetry as a reflection plane for exchange of trajectory of axial fundamental rays, said corrector also being structured to produce an exchange symmetry of off-axial fundamental rays with a point of intersection between said optical axis and said plane of symmetry as a point for centrosymmetric exchange of trajectory of said off-axial fundamental rays, wherein all fundamental rays converge at an end of the corrector, correction of spherical aberration thereby being effected by means of said first through sixth element quadrupole fields with said third and fourth element octupole fields, wherein a stigmatic intermediate image of said axial fundamental rays is produced in said first element quadrupole field, said first element quadrupole field thereby being set such that astigmatic intermediate images of said off-axial fundamental rays are produced in a region of a center of said third and said fourth element quadrupole fields, wherein said second element quadrupole field is set such that said axial fundamental rays of a same section as that in which said intermediate images of said off-axial fundamental rays are located, each exhibit a maximum in said region of said center of said third and said fourth element quadrupole fields.

2. The corrector of claim 1, further comprising an additional multipole element disposed outside said first through sixth multipole elements.

3. The corrector of claim 2, wherein said additional multipole element generates an octupole field to correct a third-order astigmatism.

4. The corrector of claim 2, wherein said additional multipole element, said third multipole element and said fourth multipole element generate duodecapole fields to correct all aberrations up to fifth order.

5. The corrector of claim 2, further comprising two transfer lenses constituted as round lenses whose fields can be set in such a way that higher-order round aberrations vanish and disposed on an objective lens side of the corrector.

6. The corrector of claim 5, wherein readjustment of said third element quadrupole and octupole fields and said fourth element quadrupole and octupole fields and of an octupole field of said additional multipole element is possible in such a way that first-order chromatic aberrations and third-order spherical aberrations recurring due to setting of said transfer lenses are eliminated.

7. The corrector of claim 6, wherein readjustment of duodecapole fields of said third and said fourth multipole elements and of said additional multipole element is possible to eliminate higher-order aberrations that recur due to said transfer lenses and said readjustment.

8. The corrector of claim 7, wherein elimination of first-order chromatic aberrations, third-order spherical aberrations and higher-order aberrations caused by readjustment of transfer lenses, of quadrupole fields and of octupole fields and thereafter of duodecapole fields and iterative setting in steps to reduce aberrations that are caused by respective, preceding readjustments, is possible, until aberrations have been reduced to a level that is tolerable for a desired imaging.

9. The corrector of claim 1, further comprising an additional multipole element is disposed in said plane of symmetry.

10. The corrector of claim 9, wherein said additional multipole element generates an octupole field to correct a third-order astigmatism.

11. The corrector of claim 9, wherein said additional multipole element, said third multipole element and said fourth multipole element generate duodecapole fields to correct all aberrations up to fifth order.

12. The corrector of claim 9, further comprising two transfer lenses constituted as round lenses whose fields can be set in such a way that higher-order round aberrations vanish and disposed on an objective lens side of the corrector.

13. The corrector of claim 12, wherein readjustment of said third element quadrupole and octupole fields and said fourth element quadrupole and octupole fields and of an octupole field of said additional multipole element is possible in such a way that first-order chromatic aberrations and third-order spherical aberrations recurring due to setting of said transfer lenses are eliminated.

14. The corrector of claim 13, wherein readjustment of duodecapole fields of said third and said fourth multipole elements and of said additional multipole element is possible to eliminate higher-order aberrations that recur due to said transfer lenses and said readjustment.

15. The corrector of claim 14, wherein elimination of first-order chromatic aberrations, third-order spherical aberrations and higher-order aberrations caused by readjustment of transfer lenses, of quadrupole fields and of octupole fields and thereafter of duodecapole fields and iterative setting in steps to reduce aberrations that are caused by respective, preceding readjustments, is possible, until aberrations have been reduced to a level that is tolerable for a desired imaging.

16. A scanning electron microscope or scanning transmission electron microscope having the corrector of claim 1.

* * * * *